United States Patent
Yang et al.

(10) Patent No.: US 10,714,424 B2
(45) Date of Patent: Jul. 14, 2020

(54) METHOD OF FORMING METAL INTERCONNECTION

(71) Applicant: Taiwan Semiconductor Manufacturing Company, Ltd., Hsin-Chu (TW)

(72) Inventors: Shin-Yi Yang, New Taipei (TW); Ming-Han Lee, Taipei (TW); Shau-Lin Shue, Hsinchu (TW); Tz-Jun Kuo, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 16/230,534

(22) Filed: Dec. 21, 2018

(65) Prior Publication Data
US 2019/0115297 A1    Apr. 18, 2019

Related U.S. Application Data

(60) Continuation of application No. 15/458,078, filed on Mar. 14, 2017, now Pat. No. 10,163,786, which is a
(Continued)

(51) Int. Cl.
*H01L 23/528* (2006.01)
*H01L 21/768* (2006.01)
(Continued)

(52) U.S. Cl.
CPC ...... *H01L 23/528* (2013.01); *H01L 21/76808* (2013.01); *H01L 21/76844* (2013.01);
(Continued)

(58) Field of Classification Search
CPC ............ H01L 23/528; H01L 21/76864; H01L 23/53242; H01L 21/76877; H01L 21/76855; H01L 21/76844
(Continued)

(56) References Cited

U.S. PATENT DOCUMENTS 6,181,013 B1    1/2001 Liu et al.
6,541,374 B1    4/2003 De Felipe et al.
(Continued)

FOREIGN PATENT DOCUMENTS

CN    1933124 A    3/2007
TW    201438107    10/2014

OTHER PUBLICATIONS

Usui, Takamasa et al., "Highly Reliable Copper Dual-Damascene Interconnects With Self-Formed MnSixOy Barrier Layer," IEEE Transactions on Electron Devices, vol. 53 No. 10, Oct. 2006, pp. 2492-2499.
(Continued)

*Primary Examiner* — Thinh T Nguyen
(74) *Attorney, Agent, or Firm* — Haynes and Boone, LLP

(57) ABSTRACT

A device includes a first conductive feature disposed over a substrate; a second conductive feature disposed directly on and in physical contact with the first conductive feature; a dielectric layer surrounding sidewalls of the second conductive feature; and a first barrier layer interposed between the second conductive feature and the dielectric layer and in physical contact with both the second conductive feature and the dielectric layer. The first barrier layer and the dielectric layer comprise at least two common elements.

20 Claims, 8 Drawing Sheets

Related U.S. Application Data division of application No. 14/858,010, filed on Sep. 18, 2015, now Pat. No. 9,613,856.

(51) Int. Cl.
   *H01L 23/532* (2006.01)
   *H01L 29/423* (2006.01)

(52) U.S. Cl.
   CPC .. *H01L 21/76855* (2013.01); *H01L 21/76864* (2013.01); *H01L 21/76877* (2013.01); *H01L 21/76879* (2013.01); *H01L 23/53214* (2013.01); *H01L 23/53228* (2013.01); *H01L 23/53233* (2013.01); *H01L 23/53238* (2013.01); *H01L 23/53242* (2013.01); *H01L 23/53257* (2013.01); *H01L 23/53271* (2013.01); *H01L 29/42376* (2013.01); *H01L 2924/0002* (2013.01)

(58) Field of Classification Search
   USPC ........ 257/751, 758, 762, 774; 438/598, 687, 438/688
   See application file for complete search history.

(56) References Cited

U.S. PATENT DOCUMENTS

| | | | |
|---|---|---|---|
| 6,919,636 B1 | 7/2005 | Ryan | |
| 7,667,271 B2 | 2/2010 | Yu et al. | |
| 7,718,524 B2 | 5/2010 | Ooka | |
| 7,910,453 B2 | 3/2011 | Xu et al. | |
| 8,072,075 B2 | 12/2011 | Jourdan et al. | |
| 8,324,738 B2 | 12/2012 | Liu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,072,075 B2 | 6/2015 | Tiwari | |
| 2005/0153544 A1 | 7/2005 | Suh et al. | |
| 2006/0003577 A1 | 1/2006 | Sone | |
| 2006/0024953 A1 | 2/2006 | Papa et al. | |
| 2006/0024962 A1 | 2/2006 | Leavy et al. | |
| 2007/0059919 A1 | 3/2007 | Ooka | |
| 2007/0249156 A1 | 10/2007 | Bonilla et al. | |
| 2008/0096380 A1 | 4/2008 | Ko et al. | |
| 2009/0273085 A1 | 11/2009 | Jourdan et al. | |
| 2010/0154213 A1 | 6/2010 | Koike et al. | |
| 2010/0155951 A1 | 6/2010 | Kolke et al. | |
| 2010/0233876 A1 | 9/2010 | Matsumoto et al. | |
| 2011/0062587 A1 | 3/2011 | Yang et al. | |
| 2011/0237066 A1* | 9/2011 | Sato et al. | ........ H01L 21/02063 438/627 |
| 2013/0015581 A1 | 1/2013 | Wann et al. | |
| 2014/0001574 A1 | 1/2014 | Chen et al. | |
| 2014/0110755 A1 | 4/2014 | Colinge | |
| 2014/0151812 A1 | 6/2014 | Liaw | |

OTHER PUBLICATIONS

Indukuri, Tejaswi K. et al., "Electrical and Reliability Characterization of CuMn Self Forming Barrier Interconnects on Low-k CDO Dielectricsm" Microelectronics Engineering 92 (2012) 49-52.

Taiwan Patent Office, Taiwanese Office Action dated Aug. 22, 2016 for Application No. 104139352, 7 pages (no translation).

* cited by examiner

METHOD OF FORMING METAL INTERCONNECTION

PRIORITY

This application is a continuation application of U.S. patent application Ser. No. 15/458,078, filed Mar. 14, 2017, which is a divisional application of U.S. patent application Ser. No. 14/858,010, filed Sep. 18, 2015, now U.S. Pat. No. 9,613,856, each of which is herein incorporated by reference in its entirety.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, challenges rise to develop robust process for forming metal interconnection with low via resistance.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
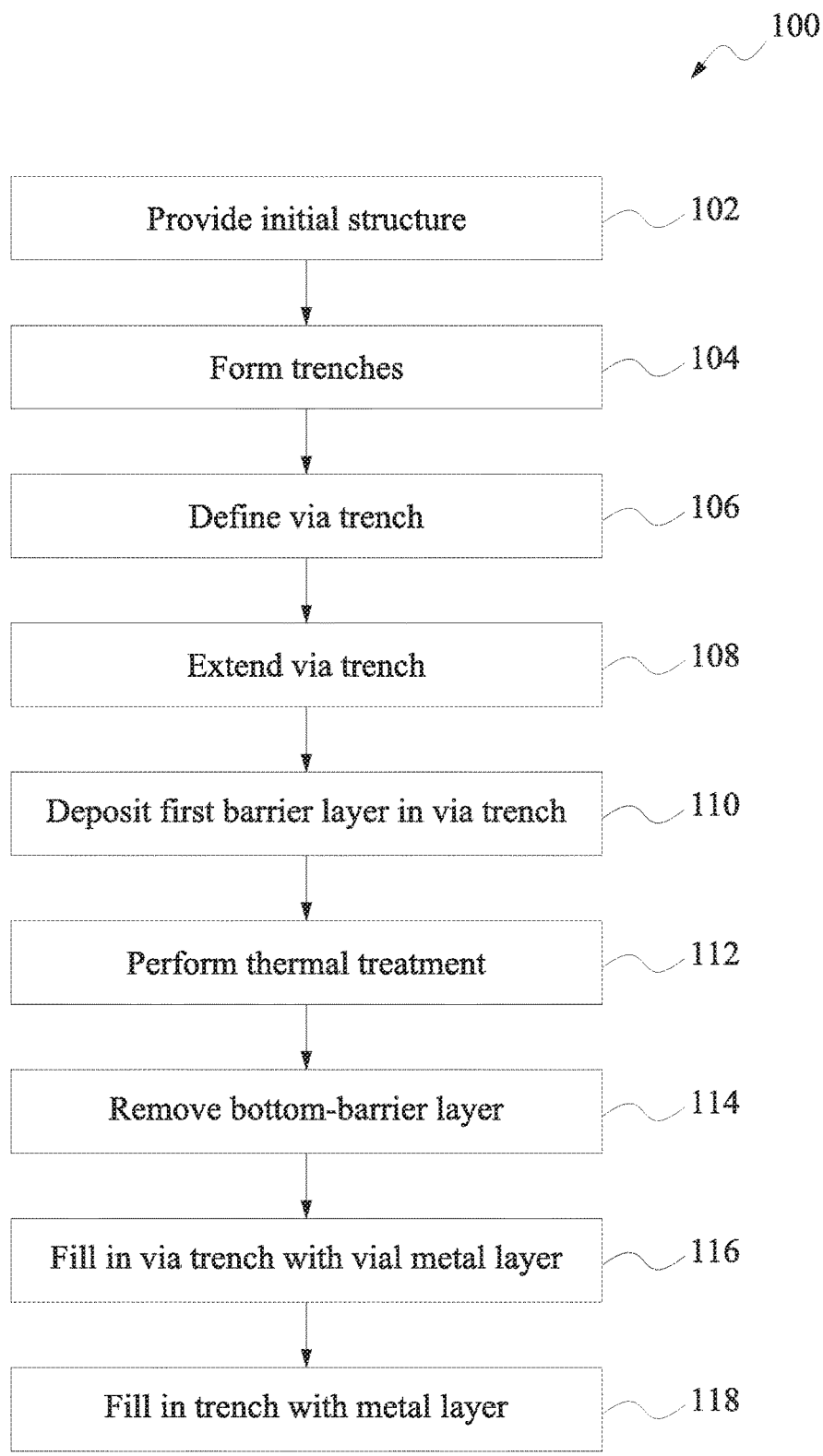
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to an initial structure 205 of a semiconductor device 200 showed in FIG. 2 and the semiconductor device 200 shown in FIGS. 3, 4, 5A, 5B, 6, 7, 8, 9, 10A, and 10B.

Figure 2:
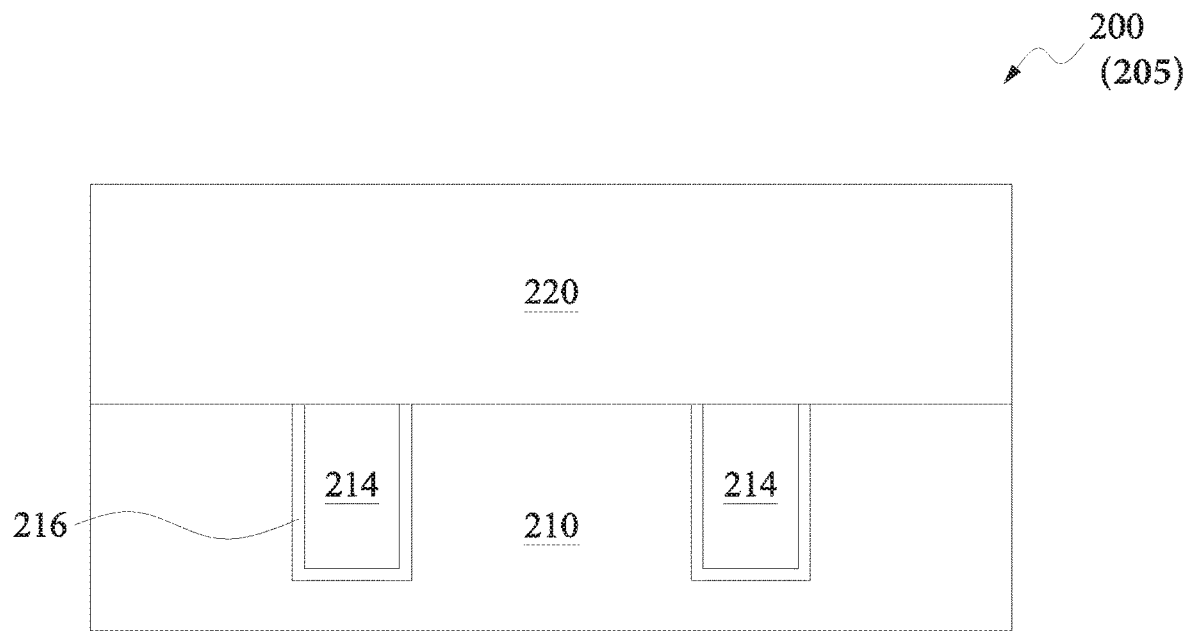
FIG. 2 is a cross-sectional view of an exemplary initial structure of a semiconductor device in accordance with some embodiments.

Referring to FIGS. 1 and 2, the method 100 starts at step 102 by providing the initial structure 205. The initial structure 205 includes a substrate 210, which may include silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate. The substrate 210 may further include lateral isolation features provided to separate various devices formed in the substrate 210. In one embodiment, shallow trench isolation (STI) features are used for lateral isolation. The various IC devices may further include other features, such as silicide disposed on S/D and gate stacks overlying channels.

The initial structure 205 may also include a plurality of dielectric layers and conductive features integrated to form an interconnect structure configured to couple the various p-type and n-type doped regions and the other functional features (such as gate electrodes), resulting a functional integrated circuit. In one example, the initial structure 205 may include a portion of the interconnect structure and is collectively referred to as the substrate 210. The interconnect structure is further described later.

As noted above, the substrate 210 includes an interconnect structure. The interconnect structure includes a multilayer interconnect (MLI) structure and an inter-level dielectric (ILD) integrated with the MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

Exemplary conductive features 214 are shown in FIG. 2 for illustration. In one embodiment, the conductive features 214 include a portion of the interconnect structure. For example, the conductive feature 214 includes a contact, a metal via, and/or a metal line. The conductive feature 214 may include aluminum (Al), copper (Cu), and/or tungsten (W). In another embodiment, the conductive feature 214 includes an electrode of a capacitor, a resistor or a portion of a resistor. Alternatively, the conductive features 214 include a doped region (such as a source or a drain), or a gate electrode. In another example, the conductive features 214 are silicide features disposed on respective source, drain or gate electrode.

In some embodiments, the conductive features 214 may be further surrounded by a barrier layer 216 to prevent diffusion and/or provide material adhesion. The barrier layer 216 may include titanium nitride (TiN), tantalum nitride (TaN), tungsten nitride (WN), titanium silicon nitride (TiSiN) and/or tantalum silicon nitride (TaSiN). The conductive features 214 and the barrier layer 216 may be formed by a procedure including lithography, etching and deposition. An example lithography process may include coating, exposure, post exposure baking, and developing processes. The etch process may include a wet etch, a dry etch, and/or a combination thereof. The deposition technique may include physical vapor deposition (PVD), chemical vapor deposition (CVD), metal-organic chemical vapor deposition (MOCVD) and atomic layer deposition (ALD), and/or other suitable technique.

The initial structure 205 also includes a dielectric layer 220 deposited over the substrate 210, including over the conductive features 214. The dielectric layer 220 may include silicon oxide, silicon nitride, a dielectric material layer having a dielectric constant (k) lower than thermal silicon oxide (therefore referred to as low-k dielectric material layer), and/or other suitable dielectric material layer. The dielectric layer 220 may include a single layer or multiple layers. The dielectric layer 220 may be deposited by CVD, atomic layer deposition (ALD) or spin-on coating.

Figure 3:
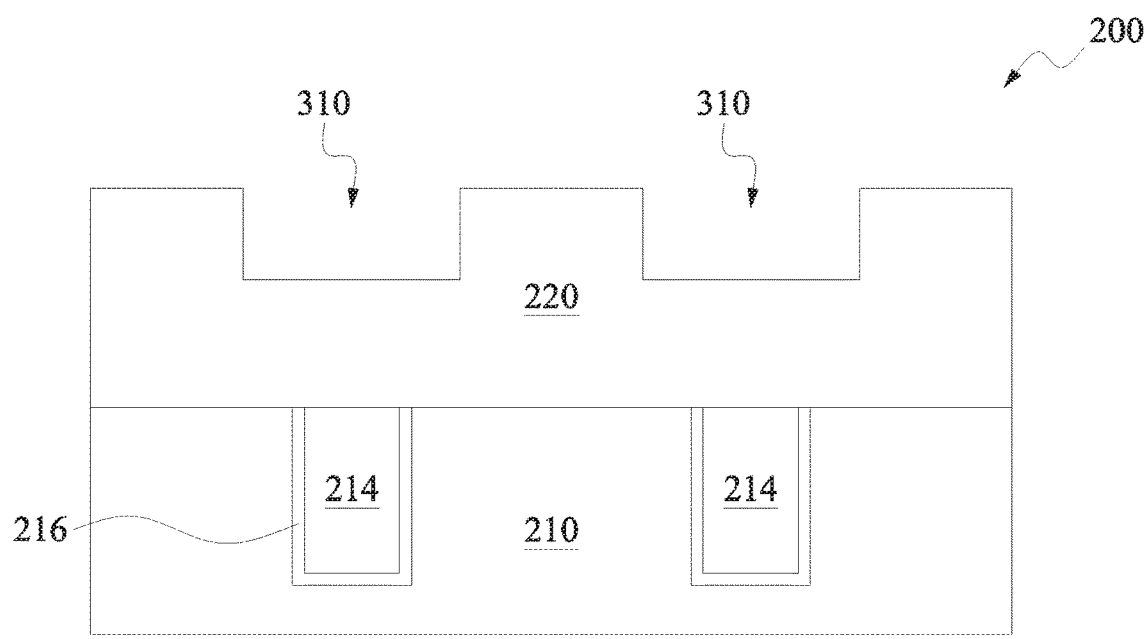
FIGS. 3, 4, 5A, 5B, 6, 7, 8, 9, 10A, and 10B are cross-sectional views of an exemplary semiconductor device in accordance with some embodiments.

Referring to FIGS. 1 and 3, once the initial structure 205 is received, the method of 100 proceeds to step 104 by removing a portion of the dielectric layer 220 to form trenches 310 in the dielectric layer 220. Trenches 310 are placeholders for conductive lines to be formed therein. Trenches 310 may be formed by a first lithography and etch processes. The first lithography process may include forming a photoresist (or resist) layer over the dielectric layer 220, exposing the resist to a pattern, performing post-exposure bake processes, and developing the resist to form a masking element including the resist. The masking element is then used for etching trenches into the dielectric layer 220. The etching process may include dry etching, wet etching, and/or other suitable processes.

Figure 4:
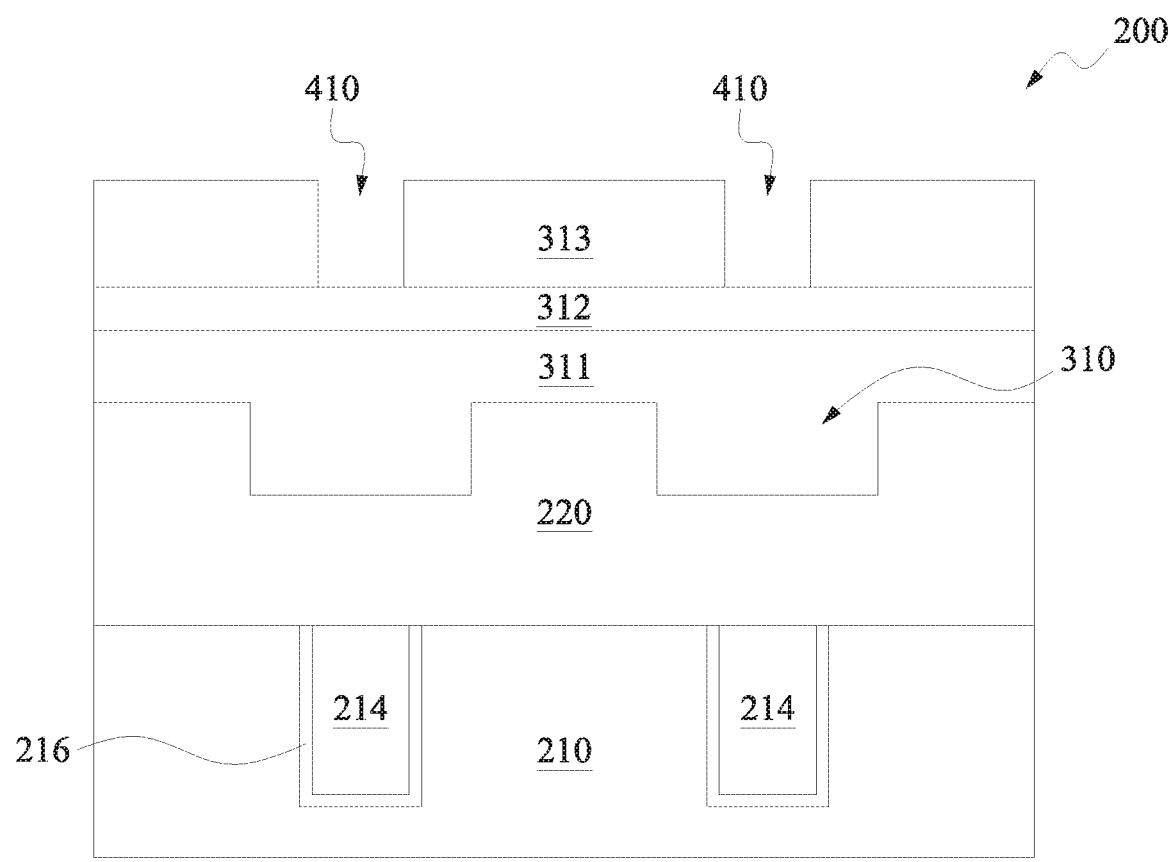

Referring to FIGS. 1 and 4, the method 100 proceeds to step 106 by performing a second lithography process to define via trenches 410 over trenches 310. As shown, illustrated therein is an exemplary lithography process using three layers of material (tri-layer lithography). The three layers are a first material layer referred to as bottom layer (BL) 311, a second material layer referred to as a middle layer (ML) 312, and a third material layer referred to as resist 313. The BL layer 311 protects the dielectric layer 220 in a subsequent etch process. In some embodiments, the BL layer 112 includes an organic polymer free of silicon. The ML 312 may include a silicon-containing layer designed to provide etch selectivity from the BL layer 311. In some embodiments, the ML 312 is also designed to function as a bottom anti-reflective coating that reduces reflection during a lithography exposure process, thereby increasing the imaging contrast and enhancing the imaging resolution. The BL 311 fills trenches 310, the ML 312 is formed over the BL 311, and the resist 313 is formed over the ML 312. Resist 313 is patterned by a photolithography process to provide via trenches 410 therein. As shown, via trenches 410 are aligned with the respective conductive features 214.

Figure 5A:
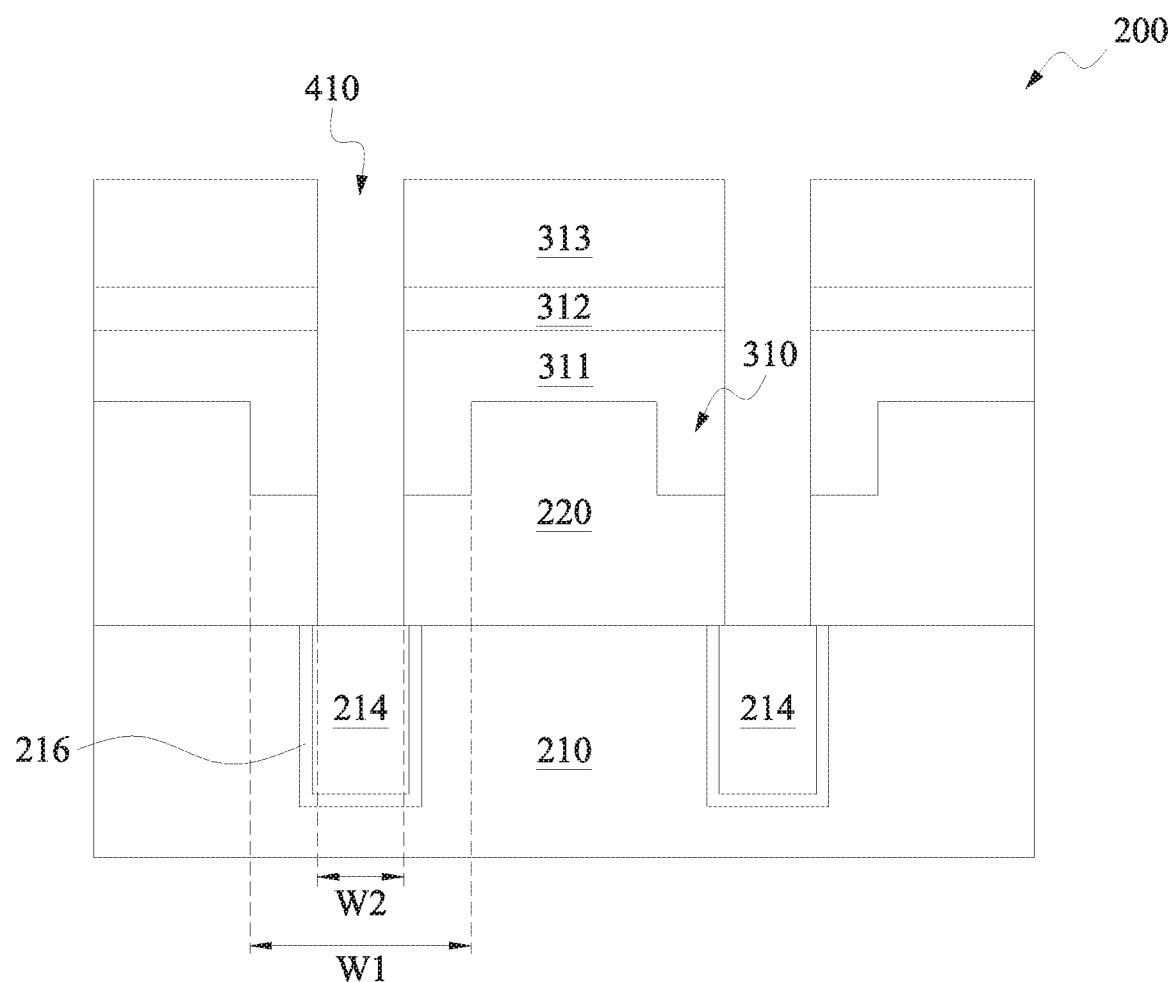

Referring to FIGS. 1 and 5A, the method 100 proceeds to step 108 by extending via trenches 410 through various underlying layers. As shown, the ML 312, the BL 311 and the dielectric layer 220 are etched through via trenches 410 to expose a portion of the conductive feature 214. In the present embodiment, trenches 310 have a first width $w_1$ which is wider than a second width $w_2$ of via trenches 410. The etch process may include a wet etch, a dry etch, and/or a combination thereof. As an example, the etch process includes a plasma dry etching process using a fluorine-based chemistry, such as $CF_4$, $SF_6$, $CH_2F_2$, $CHF_3$, and/or $C_2F_6$. The respective etch process may be tuned with various etching parameters, such as etchant used, etching temperature, etching solution concentration, etching pressure, etchant flow rate, and/or other suitable parameters.

Figure 5B:
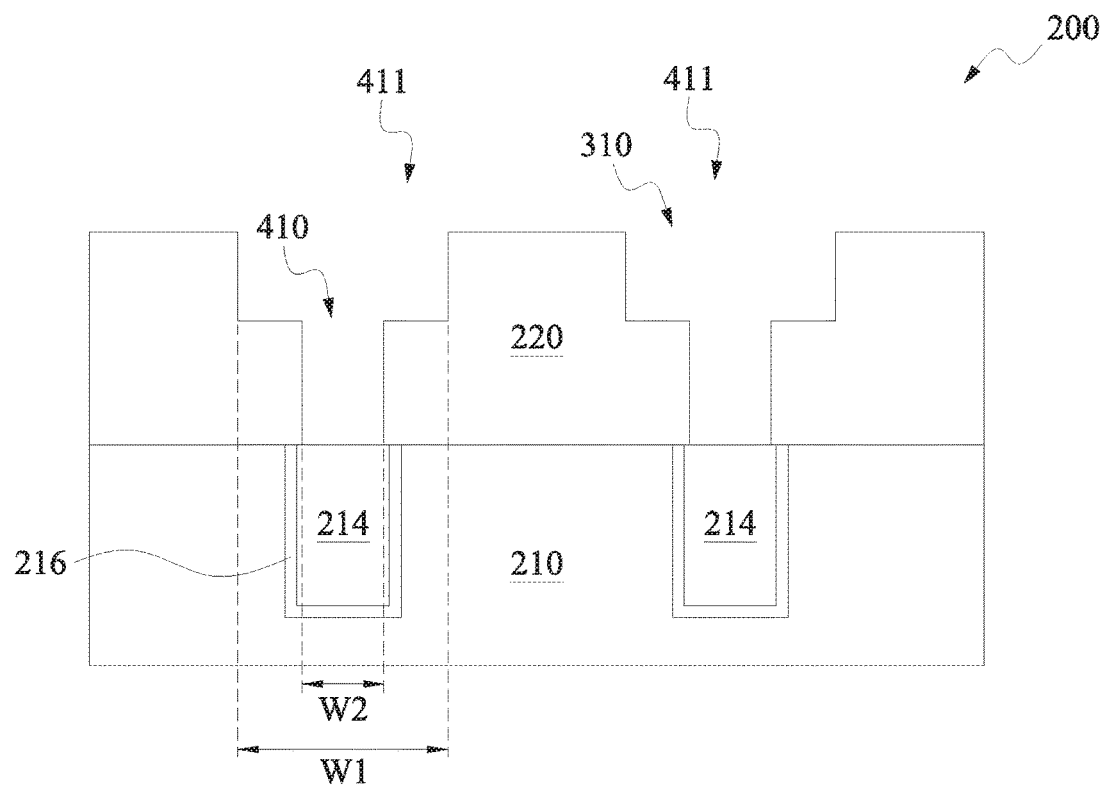

After forming via trenches 410, the remaining portions of resist 313, ML 312 and BL 311 are removed by another etch process, such as a wet stripping and/or plasma ashing. As shown in FIG. 5B, after removing the remaining portions of resist 313, ML 312 and BL 311, trenches 310 are revealed and in communication (or connected) with via trenches 410. A portion of the conductive feature 214 is exposed in the respective via trenches 410.

The combination of trench 301 and via trench 410 may be generally referred to as stepped trench (or deep trench) 411. Thus, the deep trench 411 has a upper portion with the first width $w_1$ and a lower portion with the second width $w_2$.

Figure 6:
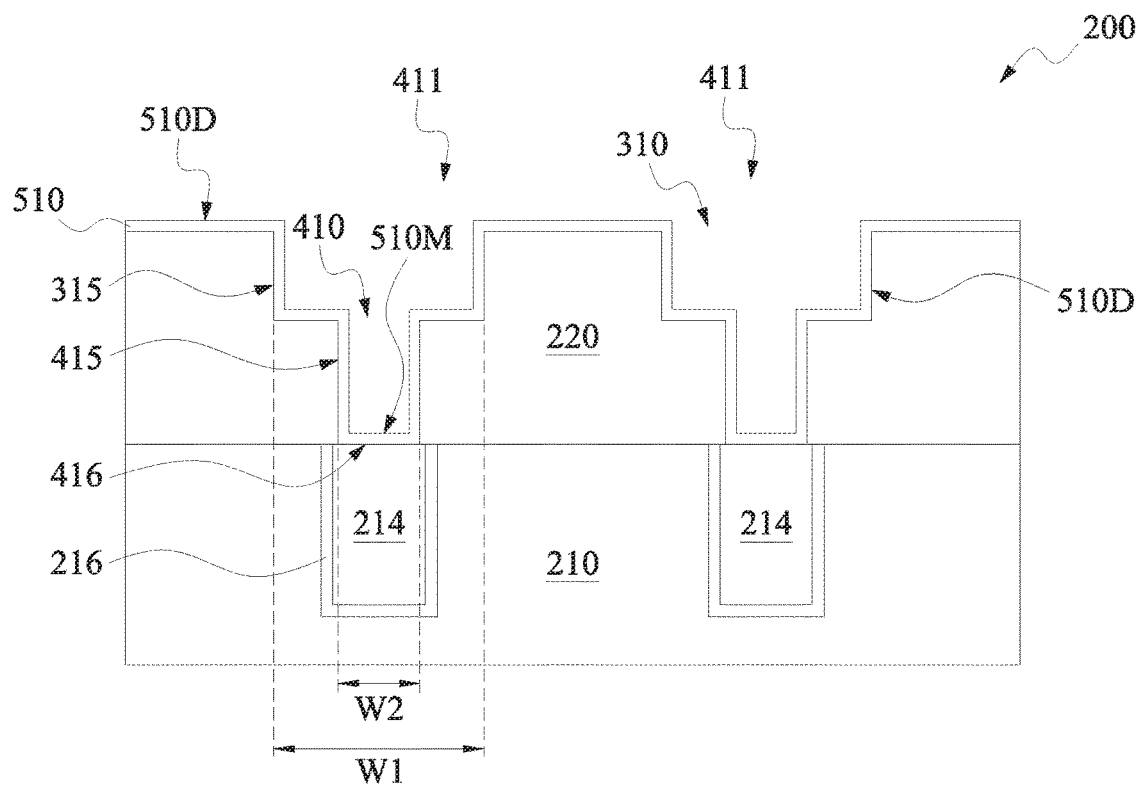

Referring to FIGS. 1 and 6, the method 100 proceeds to step 110 by depositing a first barrier layer 510 in trenches 411 (i.e. the combination of via trenches 410 and trenches 310), as well as on the top of the dielectric layer 220. The first barrier layer 510 may include manganese (Mn), manganese nitride (MnN), titanium (Ti), tantalum (Ta), cobalt (Co), cobalt tungsten (CoW), molybdenum (Mo), and/or other suitable conductive material. The first barrier layer 510 may be deposited by ALD, PVD, CVD, MOCVD, and/or other suitable technique. In some embodiment, the first barrier 510 is deposited by ALD to achieve good step coverage with a quit thin thickness. As an example, the first barrier layer 510 includes MnN layer deposited by ALD.

In the present embodiment, the first barrier layer 510 is conformably deposited along and physical contacts with first sidewalls 315 of trenches 310, second sidewalls 415 of via trenches 410 and a bottom 416 of via trenches 410 defined by the conductive features 214. Therefore, a first portion of the first barrier layer 510 extending along first sidewalls 315 and second sidewalls 415 physical contacts with the dielectric layer 220 while a second portion of the first barrier layer 510 extending along the bottom 416 physical contacts with the conductive feature 214. For the sake of clarity and simplicity, the first portion is designated with the reference numeral 510D while the second portion is designated with the reference numeral 510M.

Figure 7:
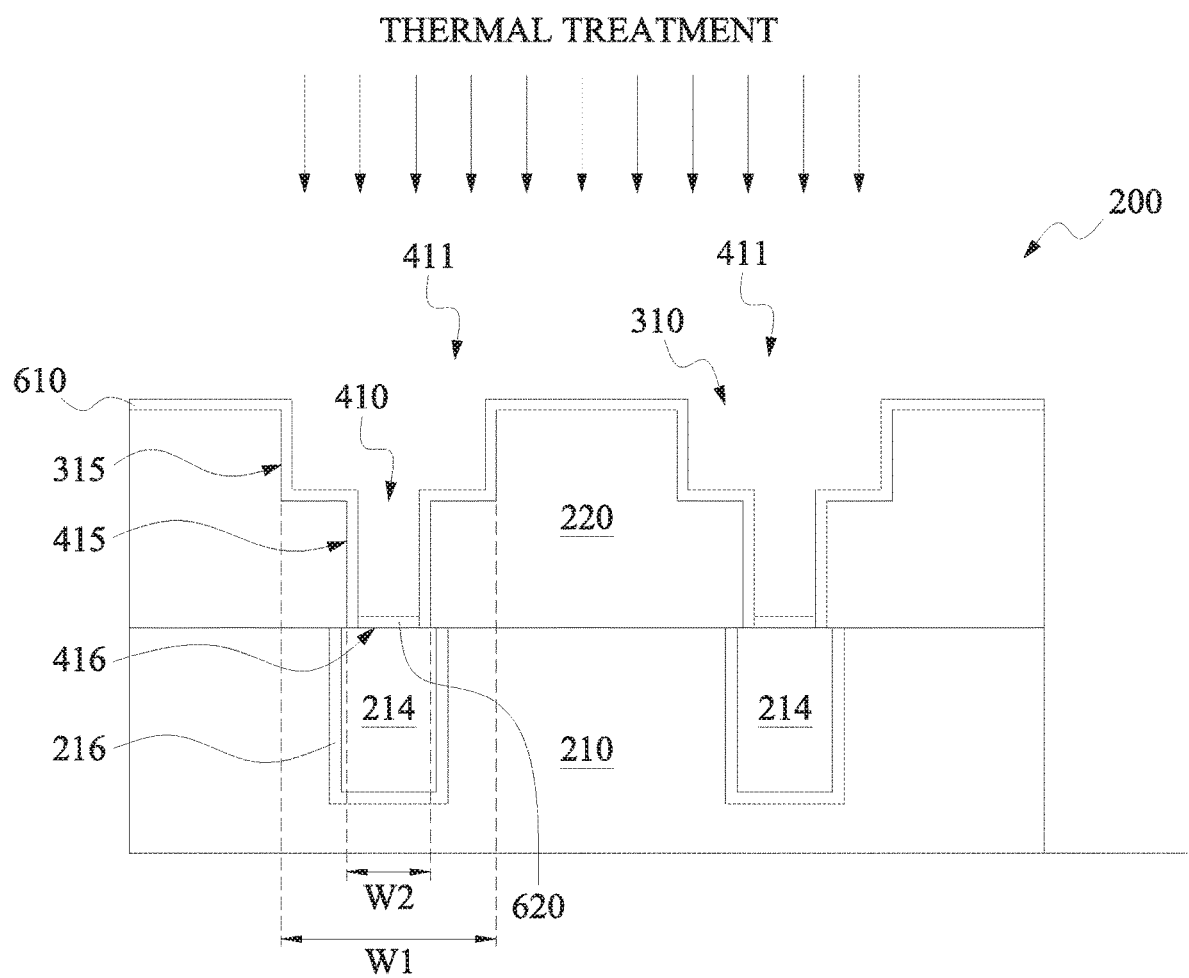

Referring to FIGS. 1 and 7, the method 100 proceeds to step 112 by performing a thermal treatment to transform (or convert) the first portion 510D and the second portion 510M into different barrier layers. In some embodiments, during the thermal treatment, the first portion 510D reacts with the dielectric layer 220 to thereby transform into a second barrier layer 610 while the second portion 510M reacts with the conductive feature 214 to thereby transform into a third barrier layer 620 (or bottom-barrier layer). In such an embodiment, the second barrier layer 610 is formed of a different material than the third barrier layer 620.

Alternatively, in some embodiments, during the performance of the thermal treatment to transform (or convert) the first portion 510D into the second barrier layer 610, the second portion 510M remains intact and the third barrier layer 620 is formed of the same material as the first barrier 510.

In the present embodiment, the second barrier layer 610 has a substantial different etch selectivity comparing with the bottom-barrier layer 620 in a subsequent etch. The first barrier layer 510 and the dielectric layer 220 are chosen such that the second barrier 610 formed with adequate ability to enhance adhesion and prevent inter-diffusion and reactions between the dielectric layer 220 and metal layers to be filled in via trenches 410 and trenches 310. In an example, the first barrier layer 510 includes MnN while the dielectric layer 220 includes silicon oxide. After the thermal treatment, the first portion 510D converts to $MnSi_xO_yN_z$ while the second portion 510M has almost no reaction with the conductive feature 214 and thus the bottom-barrier layer 620 remains as the MnN layer 510M. Here, x represents Si composition in atomic percent, y represents oxygen composition in atomic percent and z represents nitrogen composition in atomic percent.

With the thermal treatment, the second and third barrier layers, 610 and 620, are formed with self-selective-formation nature, which provides process simplicity and relaxes process constrains. Especially, converting by the thermal treatment, the second barrier layer 610 may carry film characteristics of the first barrier layer 510, such as good step coverage with a thin thickness, which provides a good sidewall protection for a metal layer to be filled in via trenches 410 and avoids formation of overhang.

The thermal treatment may comprise a rapid thermal anneal (RTA), a laser anneal, a furnace anneal, and/or a flash lamp anneal. As an example, the thermal treatment is performed, with a temperature range from 100° C. to 400° C., by using noble gases such as helium (He), neon (Ne), argon (Ar), krypton (Kr), xenon (Xe) and nitrogen ($N_2$). As another example, the thermal treatment is performed in a vacuum environment.

Figure 8:
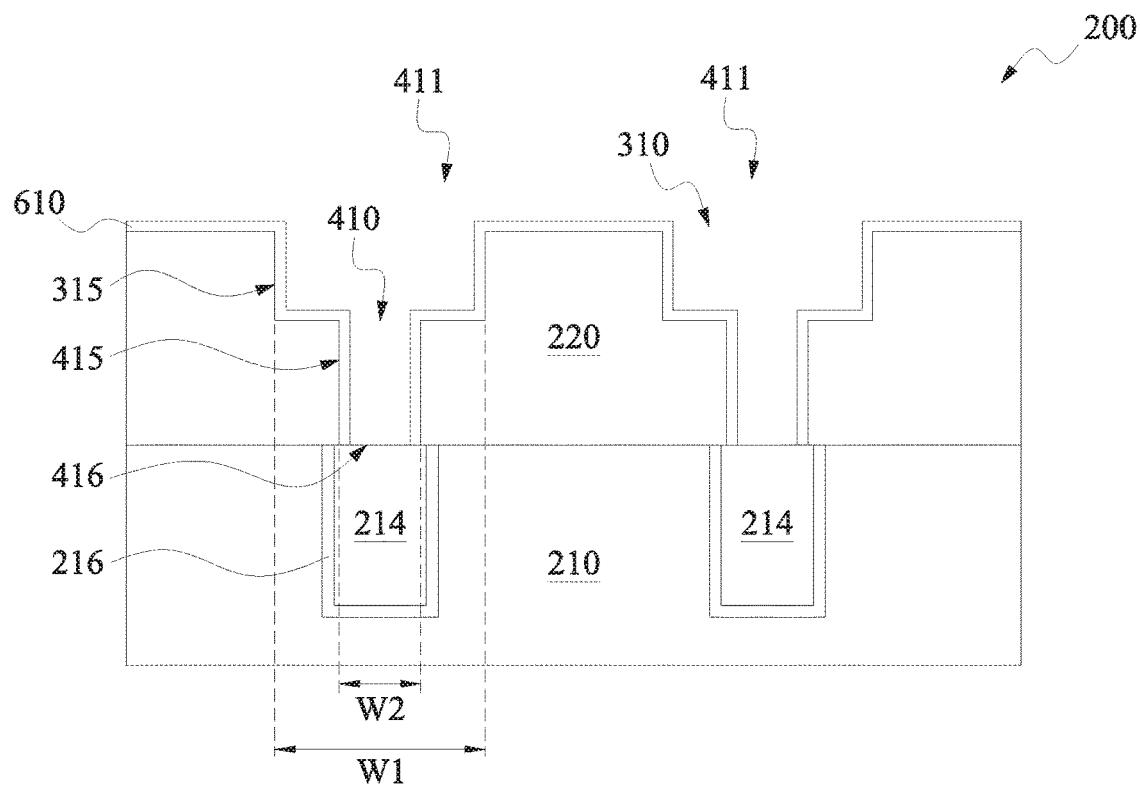

Referring to FIGS. 1 and 8, the method 100 proceeds to step 114 by removing the third barrier layer 620. In the present embodiment, a selective etch is performed such that the etch process etches the third barrier layer 620 without substantially etching the second barrier layer 610 and the conductive feature 214. A selective etch process provides process simplicity and relaxes process constrains. The selective etch may include a selective wet etch, a selective dry etch, and/or a combination thereof. As discussed above, in some embodiments, the third barrier layer 620 is formed of the same material as the first barrier layer 510, namely MnN, while the second barrier layer 610 is $MnSi_xO_yN_z$ and the first conductive feature is Cu. In such an embodiment, without substantially etching the $MnSi_xO_yN_z$ barrier layer 610, the MnN third barrier layer 620 is removed by an aqueous wet clean process with a weak acid solution (pH value less than 7). The aqueous wet clean process adds simplicity to the manufacturing process and also minimizes process-induced-damage to the conductive feature 214.

In the present embodiment, after removing the third barrier layer 620, the contact features 214 are exposed within via trenches 410. The resistance of a bottom barrier layer (e.g. third barrier layer 620) deposited on the bottom of via trenches 410 is usually much higher than a resistance of a metal layer deposited in via trenches 410 over such a bottom barrier layer. Therefore, the resistance of a bottom barrier layer dominates a resistance of a conductive interconnection formed by the combination of the bottom barrier layer and the metal layer. This resistance is referred to as via resistance. In the present embodiment, the method 100 provides a bottom-barrier-free scheme.

Figure 9:
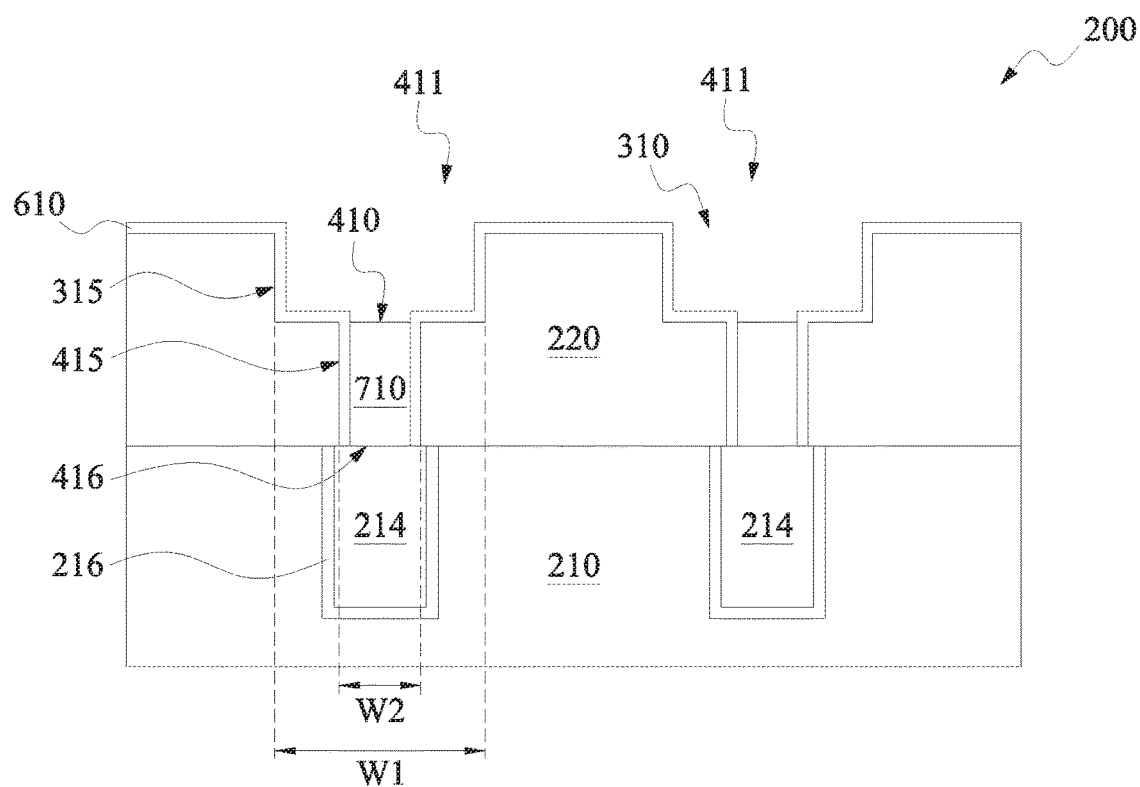

Referring to FIGS. 1 and 9, the method 100 proceeds to step 116 by forming a via metal 710 in via trenches 410. The via metal 710 physical contacts with the conductive feature 214. The via metal 710 may include copper or copper alloy, such as copper manganese (CuMn), copper aluminum (CuAl), copper titanium, (CuTi), copper vanadium (CuV), copper chromium (CuCr), copper silicon (CuSi) and/or copper niobium (CuNb). The via metal 710 may be formed by PVD, CVD, MOCVD, electroless deposition (ELD), and/or other suitable technique. In the present embodiment, the via metal 710 is formed by ELD process, which provides a low process temperature, an intrinsic process selectivity and conformal bottom-up deposition to reduce via trench gap-fill challenge. In one embodiment, the via metal 710 is Cu deposited by ELD process. As shown, the vial metal 710 has the second barrier 610 as its sidewall barrier and thereby it improves device reliability by limiting electron migration (EM) and time-dependent dielectric breakdown (TDDB) associated with via metal diffusion into the underlying dielectric layer 220. Also, by having sidewall barrier layer, constrains in choosing candidates for via metal layer 710 is also relaxed.

Figure 10A:
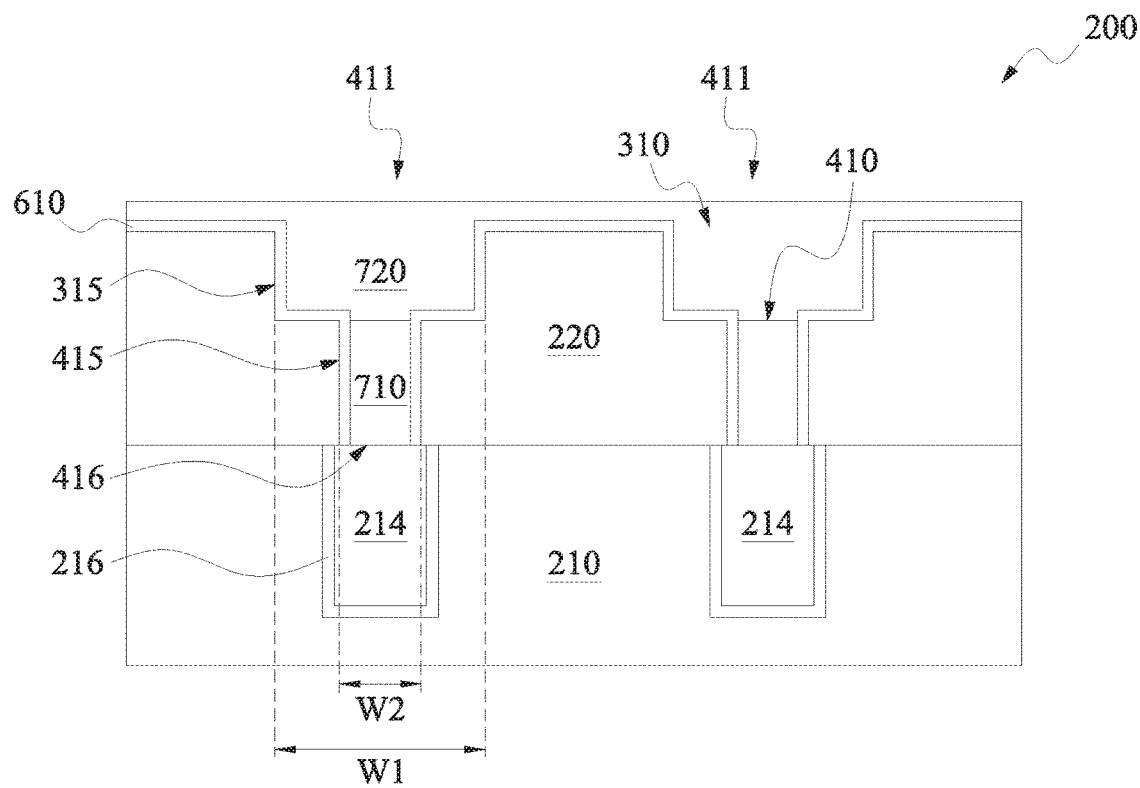

Referring to FIGS. 1 and 10A, the method 100 proceeds to step 118 by filling in trenches 310 with a metal layer 720. In the present embodiment, the metal layer 720 is deposited over and directly contacts with the via metal 710. In the present embodiment, without a barrier layer on an interface of the via metal 710 and the metal layer 720, a resistance contributed by the via metal 710 and the metal layer 720 together is reduced. The metal layer 720 may include Cu, Co, W, Ru, Ag, Au, CoW, CoF, CoSi, or other suitable metals. The conductive layer 720 may be deposited by PVD, CVD, MOCVD, or plating. In one embodiment, the conductive layer 720 includes a Cu layer deposited by PVD. In one embodiment, the conductive layer 720 includes a Cu layer deposited by plating. In various other examples, Cu deposition may be implemented by other techniques. A Cu reflow process may be added to enhance Cu filling profile.

By forming via metal 710 and the metal layer 720 separately, it provides the benefit of using different deposition processes to better suit the different needs of the via trench 410 and the trench 310. The scheme is sometimes referred as via pre-fill scheme. For example, an ELD process is used to form the via metal 710 for its adequate conformal deposition in gap-filling while a PVD process is used to fill in the trench 310, which has a wider gap, for its higher deposition rate and lower process cost comparing with the ELD process.

Figure 10B:
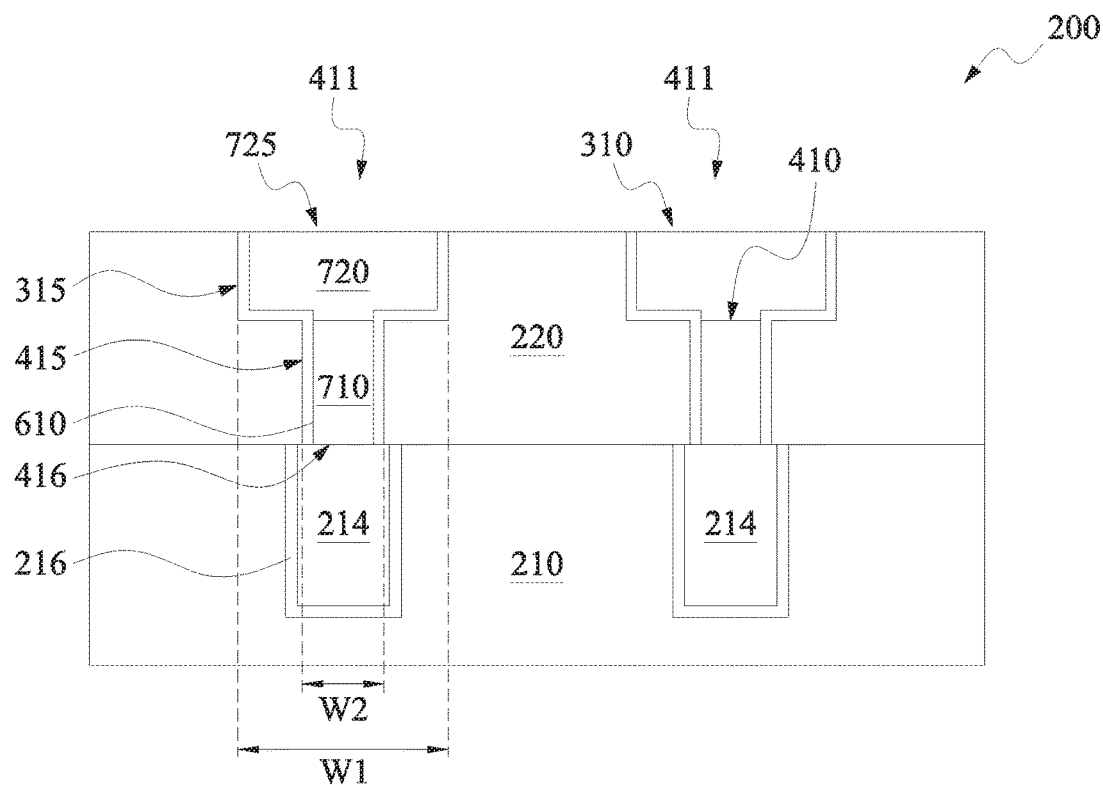

Additionally, a chemical mechanical polishing (CMP) process is performed to planarize the top surface of the device 200 to remove excessive metal layer 720 and the second barrier layer 610 over the dielectric layer 220, as shown in FIG. 10B. The second barrier layer 610 and metal layer 720 in trenches 310 remain, forming the conductive lines 725. As a result of the CMP process, the top surface of the dielectric layer 220 and the top surface of the conductive lines 725 are substantially coplanar.

Additional steps can be provided before, during, and after the method 100, and some of the steps described can be replaced, eliminated, or moved around for additional embodiments of the method 100. For example, instead of forming via metal 710 and depositing metal layer 720 separately, in step 116 and step 118 respectively, via metal 710 and metal layer 720 are formed by one deposition process.

The semiconductor devices, 200, may include additional features, which may be formed by subsequent processing. For example, various vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines.

Based on the above, it can be seen that the present disclosure provide methods of forming a bottom-barrier-free metal interconnection for achieving low via contact resistance, such that bottom-barrier-free at the bottom of via metal and at the bottom of the metal line, which is formed over and physical contacts the via metal. The method provides sidewall barrier for ELD via metal to improve TDDB and electron migration (EM). The method provides a robust metal interconnection formation process with selective formation and selective etch to relax process constrains and simplify the manufacturing process.

The present disclosure provides many different embodiments of fabricating a semiconductor device that provide one or more improvements over existing approaches. In one embodiment, a method for fabricating a semiconductor device includes forming a first conductive feature over a substrate, forming a dielectric layer over the first conductive feature, forming a trench in the dielectric layer. The trench has a first width in its lower portion and a second width in its upper portion and the second width is greater than the first width. The first conductive feature is exposed within the trench. The method also includes forming a first barrier layer in the trench. The first barrier has a first portion disposed over the dielectric layer and a second portion disposed over the first conductive feature. The method also includes applying a thermal treatment to convert the first portion of the barrier layer to a second barrier layer, exposing the first conductive feature in the trench while a portion of the second barrier layer is disposed over the dielectric layer and forming a second conductive feature in the trench.

In yet another embodiment, a method includes forming a dielectric layer over a first conductive feature disposed on a substrate, forming a trench in the dielectric layer. The trench has a first width in its upper portion and a second width in its lower portion. The first width is greater than the second width. The first conductive feature is exposed within the trench. The method also includes forming a first barrier layer in the trench. A first portion of the first barrier is formed along a sidewall surface of the trench defined by the dielectric layer and a second portion of the first barrier layer is formed along a bottom surface of the trench defined by the first conductive feature. The method also includes converting the first portion of the first barrier layer into a second barrier layer. The second barrier layer is formed of a different material than the first barrier layer. The method also includes exposing the first conductive feature in the trench while a portion of the second barrier layer is disposed over the dielectric layer and forming a second conductive feature in the trench.

In yet another embodiment, a semiconductor device includes a first conductive feature disposed over a substrate, a second conductive feature disposed over the first conductive feature. The second conductive feature has an upper portion having a first width and a lower portion having a second width that is different than the first width. The lower portion is in physical contact with a top portion of the first conductive feature. The device also includes a first barrier layer disposed along sidewalls of the second conductive feature and a dielectric layer disposed along the first barrier layer. The dielectric layer is in physical contact with a side of the first barrier layer that faces away from the second conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first conductor;
   a dielectric layer disposed on the first conductor;
   a via conductor disposed in the dielectric layer and extending to the first conductor such that the via conductor physically contacts the first conductor;
   a second conductor disposed in the dielectric layer and on the via conductor; and
   a barrier layer interposed between the via conductor and the dielectric layer, and between the second conductor and the dielectric layer, wherein the barrier layer includes a metal and at least two elements included in the dielectric layer.

2. The device of claim 1, wherein the barrier layer is physically coupled to the first conductor.

3. The device of claim 1, wherein the at least two elements included in the dielectric layer and the barrier layer include a semiconductor and a material selected from the group consisting of oxygen and nitrogen.

4. The device of claim 1, wherein the metal includes at least one material selected from the group consisting of manganese, manganese nitride, titanium, tantalum, cobalt, cobalt tungsten, and molybdenum.

5. The device of claim 1, wherein the dielectric layer is physically coupled to a top surface of the first conductor.

6. An integrated circuit device comprising:
   a first conductive feature;

a dielectric layer disposed on the first conductive feature, the dielectric layer having two material elements;

a via conductive feature embedded within the dielectric layer, and extending through the dielectric layer to couple to and to directly contact the first conductive feature;

a second conductive feature embedded within the dielectric layer and disposed on top of the via conductive feature; and a barrier layer having the two material elements disposed between the via conductive feature and the dielectric layer, and between the second conductive feature and the dielectric layer.

7. The integrated circuit device of claim 6, wherein the barrier layer and the dielectric layer are each physically coupled to a top surface of the first conductive feature.

8. The integrated circuit device of claim 6, wherein the two material elements are silicon and oxygen.

9. The integrated circuit device of claim 6, wherein the barrier layer is disposed on a side surface and a bottom surface of the second conductive feature.

10. The integrated circuit device of claim 6, wherein the barrier layer includes a semiconductor element present in the dielectric layer.

11. The integrated circuit device of claim 6, wherein the barrier layer is a first barrier layer, the integrated circuit device further comprising a second barrier layer disposed alongside the first conductive feature, wherein the first barrier layer and the second barrier layer are different in composition.

12. The integrated circuit device of claim 11, wherein the first barrier layer includes silicon, oxygen, and a material selected from the group consisting of manganese, manganese nitride, titanium, tantalum, cobalt, cobalt tungsten, and molybdenum; and wherein the second barrier layer includes a material selected from the group consisting of titanium nitride, tantalum nitride, tungsten nitride, titanium silicon nitride, and tantalum silicon nitride.

13. A device comprising:

a first conductive feature;

a dielectric layer disposed on the first conductive feature;

a via conductive feature disposed within the dielectric layer and interfacing with the first conductive feature;

a second conductive feature disposed within the dielectric layer and over the via conductive feature; and a first material layer disposed on a side surface of the second conductive feature between the second conductive feature and the dielectric layer, the first material layer including two elements of the dielectric layer.

14. The device of claim 13, wherein the first material layer is further disposed between the via conductive feature and the dielectric layer.

15. The device of claim 13, further comprising a second material layer disposed alongside the first conductive feature, wherein the second material layer has a composition different from a composition of the first material layer.

16. The device of claim 13, wherein the two elements include one of oxygen and nitrogen.

17. The device of claim 13, wherein the dielectric layer includes a semiconductor oxide and the first material layer includes a metal and the semiconductor oxide.

18. The device of claim 13, wherein the first material layer is physically coupled to a top surface of the first conductive feature.

19. The device of claim 18, wherein the dielectric layer is physically coupled to the top surface of the first conductive feature.

20. The device of claim 13, wherein the first material layer is further disposed between a bottom surface of the second conductive feature and the dielectric layer.

* * * * *